United States Patent
Hsieh

(10) Patent No.: US 7,599,504 B2
(45) Date of Patent: Oct. 6, 2009

(54) APPARATUS AND METHOD FOR ADJUSTING SOUND VOLUME FOR TELEVISIONS AND OTHER AUDIO SYSTEMS

(75) Inventor: Kuan-Hong Hsieh, Tu-Cheng (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 1035 days.

(21) Appl. No.: 10/955,285

(22) Filed: Sep. 30, 2004

(65) Prior Publication Data
US 2005/0271224 A1 Dec. 8, 2005

(30) Foreign Application Priority Data
Jun. 2, 2004 (TW) .............................. 93102725 A

(51) Int. Cl.
*H03G 7/00* (2006.01)
(52) U.S. Cl. ...................... 381/107; 381/106
(58) Field of Classification Search ......... 381/102–109, 381/57, 58; 348/738
See application file for complete search history.

(56) References Cited

U.S. PATENT DOCUMENTS

| 4,405,831 A | * | 9/1983 | Michelson .................. 381/108 |
| 5,130,665 A | | 7/1992 | Walden |
| 6,552,753 B1 | | 4/2003 | Zhurbinskiy et al. |

* cited by examiner

Primary Examiner—Ping Lee
(74) Attorney, Agent, or Firm—Frank R. Niranjan

(57) ABSTRACT

An apparatus for adjusting sound volume for an audio system includes a controller (101) connected to an amplifier (40) of the audio system, an audio processor (104), a circuit (102) for adjusting sound volume, and a communication port (103). The controller controls the amplification of the amplifier through the communication port. The circuit includes an adjustor (1022) connected to the audio processor, and a switch (1024) coupled to the audio processor. The controller controls the switch to switch an operating mode of the circuit between a normal mode and an attenuation mode. The adjustor is coupled to the switch. In the normal mode, the switch directly transmits unadjusted audio signals to the audio processor. In the attenuation mode, the audio processor controls the adjustor to output unadjusted audio signals or attenuated audio signals. A related method for adjusting sound volume for an audio system is also disclosed.

14 Claims, 3 Drawing Sheets

APPARATUS AND METHOD FOR ADJUSTING SOUND VOLUME FOR TELEVISIONS AND OTHER AUDIO SYSTEMS

CROSS-REFERENCE TO RELATED APPLICATIONS

This application is related to a copending U.S. patent application Ser. No. 10/955,455 and entitled "APPARATUS AND METHOD FOR ADJUSTING SOUND VOLUME FOR TELEVISIONS AND OTHER AUDIO SYSTEMS", filed on Sep. 30, 2004 with the same applicant and assignee as the invention. The disclosure of the above identified application is incorporated herein by reference.

BACKGROUND OF THE INVENTION

1. Field of the Invention

The present invention relates to apparatuses and methods for adjusting sound volume for televisions and other audio systems.

2. Description of the Prior Art

At times, a television or radio may broadcast an unexpected, noisy transmission to a user due to a programming change or when there are problems with reception. For example, a television or radio program provider may intentionally broadcast an advertisement at an abruptly high volume so as to attract a user's attention. On other occasions, signals received by the television or radio may be interfered with by signals transmitted by other electronic devices, thereby generating static or other unwanted transmissions. Loud advertisements or unexpected noises are perhaps least likely to bother the user during the daytime or in an environment that is otherwise relatively noisy. However, the user is likely to be easily bothered late at night or in a relatively quiet environment.

In order to overcome the above-mentioned problem, U.S. Pat. No. 5,130,665, issued on Jul. 14, 1992, discloses an audio volume controller. When the audio volume controller is in a control mode, the audio volume controller outputs audio signals whose volumes are between a predefined minimum volume and a predefined maximum volume. Therefore, the audio volume controller cannot output any audio signal whose volume is higher than the predefined maximum volume. This enables the user to avoid being bothered by loud noises. However, the user cannot freely adjust the average level of the sound produced by the audio volume controller in the control mode unless he/she switches the audio volume controller to exit the control mode. Thus, it is not convenient for the user to use the audio volume controller.

SUMMARY OF THE INVENTION

Accordingly, a primary object of the present invention is to provide an apparatus for facilitating a user to not only freely adjust an average level of sound produced by an audio system according to his/her particular requirements, but also simultaneously avoid being bothered by loud transmissions.

A second object of the present invention is to provide a method for facilitating a user to not only freely adjust an average level of sound produced by an audio system according to his/her particular requirements, but also simultaneously avoid being bothered by loud transmissions.

In order to fulfill the above-mentioned primary object, the present invention provides an apparatus for adjusting sound volume for an audio system. The apparatus comprises a controller connected to an amplifier of the audio system, an audio processor, a circuit for adjusting sound volume, and a communication port. The controller controls the amplification of the amplifier through the communication port. The controller comprises a Microprogrammed Control Unit (MCU), a Random-Access Memory (RAM) communicating with the MCU, and a nonvolatile memory communicating with the MCU. The circuit comprises an adjustor connected to the audio processor, and a switch coupled to the audio processor. The MCU controls the switch to switch an operating mode of the circuit between either of two modes: a normal mode or an attenuation mode. The adjustor is coupled to the switch. In the normal mode, the switch directly transmits unadjusted audio signals to the audio processor. In the attenuation mode, the audio processor controls the adjustor to output unadjusted audio signals or attenuated audio signals.

In order to fulfill the above-mentioned second object, the present invention provides a method for adjusting sound volume for an audio system. An exemplary embodiment of the method comprises the following steps: (a) determining whether an apparatus for adjusting sound volume is in an attenuation mode; (b) if so, controlling a switch to switch a circuit for adjusting sound volume to an attenuation mode; (c) determining whether volume levels of input audio signals are higher than a threshold value; (d) if so, controlling an adjustor to output attenuated audio signals to the switch; and (e) repeating steps (a) through (d) until the audio system is turned off.

Other objects, advantages and novel features of the present invention will become more apparent from the following detailed description when taken in conjunction with the accompanying drawings, in which:

DETAILED DESCRIPTION OF THE INVENTION

Figure 1:
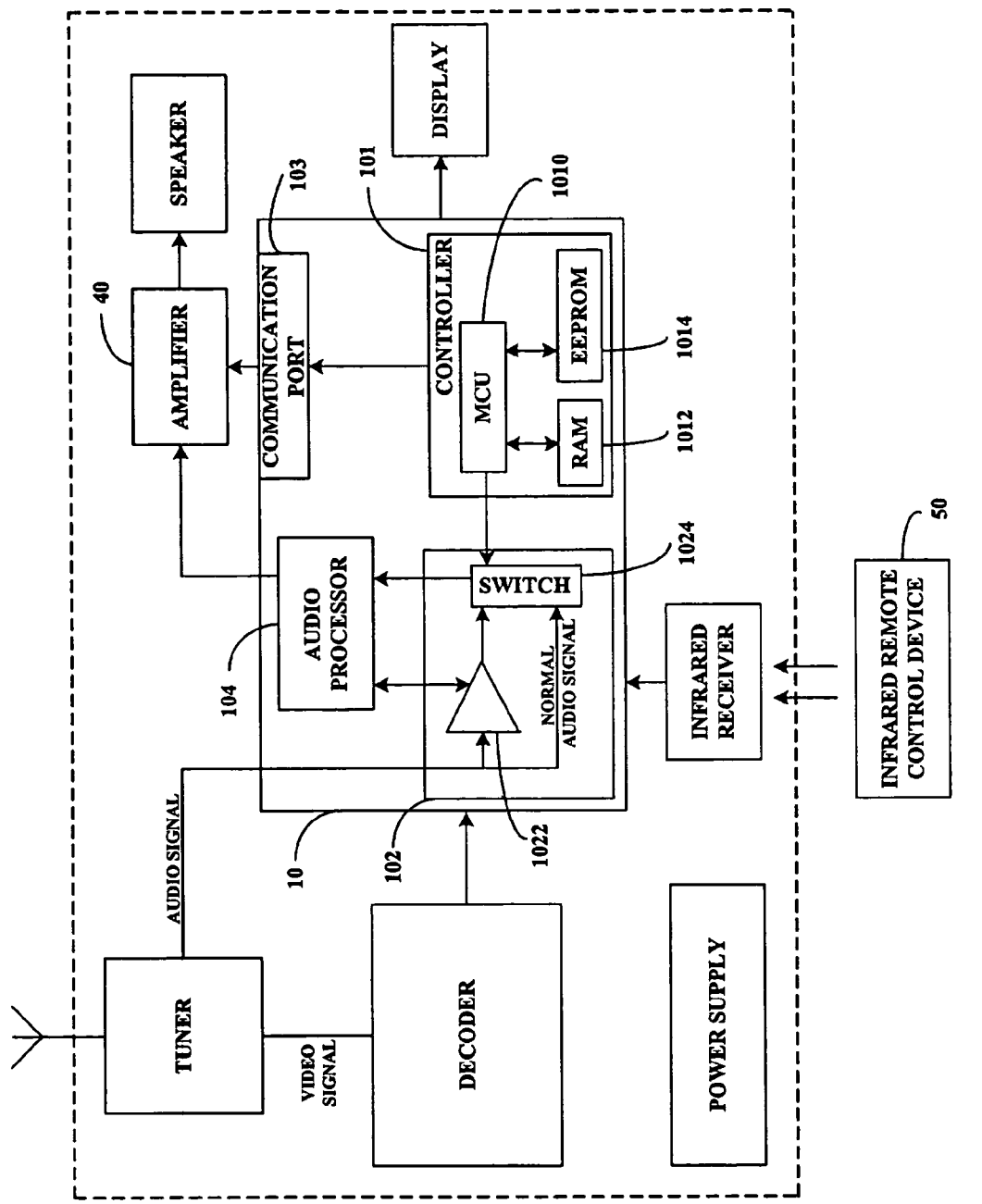
FIG. 1 is a simplified block diagram of part of a television with an apparatus for adjusting sound volume in accordance with the present invention.

FIG. 1 is a simplified block diagram of part of an audio system of a television with an apparatus 10 for adjusting sound volume according to the present invention. The apparatus 10 can run in either of two operating modes: a normal mode and an attenuation mode. A viewer switches the apparatus 10 to either one of the above-mentioned operating modes by use of an infrared remote control device 50 or a function key (not shown) on the television itself. The apparatus 10 comprises a controller 101, a circuit 102 for adjusting sound volume, a communication port 103, and an audio processor 104. The controller 101 comprises a Microprogrammed Control Unit (MCU) 1010, a Random-Access Memory (RAM) 1012, and an Electrically Erasable Programmable Read-Only Memory (EEPROM) 1014. The RAM 1012 and the EEPROM 1014 communicate with the MCU 1010. By way of the communication port 103, the controller 101 controls the amplification of an amplifier 40 of the television. In other exemplary embodiments, the EEPROM 1014 may be replaced by any other nonvolatile memory, such as a Read-Only Memory (ROM), an Erasable and Programmable Read-only Memory (EPROM) or a flash memory.

The operating mode of the circuit 102 corresponds to the operating mode of the apparatus 10. When the apparatus 10 is in the normal mode, the circuit 102 is also in a normal mode; similarly, when the apparatus 10 is in the attenuation mode, the circuit 102 is also in an attenuation mode. The circuit 102 comprises an adjustor 1022, and a switch 1024 for switching the operating mode of the circuit 102. The adjustor 1022 is connected to the switch 1024 and the audio processor 104. The audio processor 104 controls output of an audio signal received by the adjustor 1022 from a tuner of the television. The switch 1024 is coupled to the MCU 1010. The MCU 1010 controls the switch 1024 to switch the operating mode of the circuit 102 according to the operating mode of the apparatus 10. The tuner of the television transmits the audio signal to the adjustor 1022 and the switch 1024 separately. The switch 1024 transmits an unadjusted audio signal or the audio signal processed through the adjustor 1022 to the audio processor 104.

Figure 2:
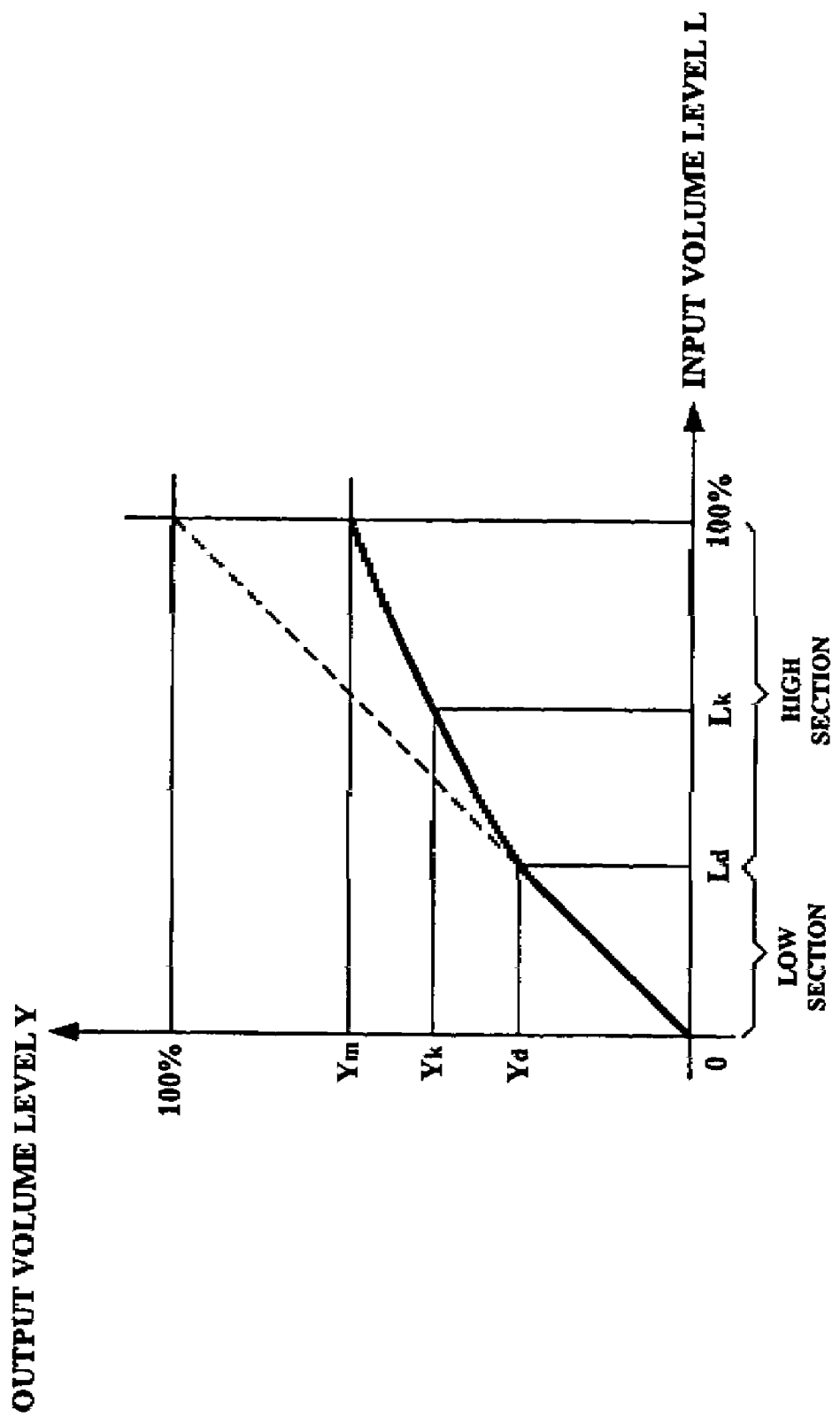
FIG. 2 is a graph of operation performance of the apparatus of FIG. 1.

FIG. 2 is a graph of operation performance of the apparatus 10. The horizontal abscissa represents an input volume level L of the audio signal to the apparatus 10, and the vertical ordinate represents an output volume level Y of the audio signal by the apparatus 10. When the viewer selects the normal mode of the apparatus 10 through the infrared remote control device 50 or the functional key on the television, the MCU 1010 controls the switch 1024 to switch the circuit 102 to the normal mode. In such case, the audio signal transmitted by the tuner of the television is input to the switch 1024, and then transmitted to the audio processor 104. The broken line in FIG. 2 describes a relationship between the input volume level and the output volume level of the audio signal traveling through the apparatus 10 when the apparatus 10 is in the normal mode. A lower part of the broken line is obscured by a solid line (see explanation hereinbelow). The audio signal may correspond to a television program, an advertisement, or an unexpected noise such as interference. In short, the audio signal output by the apparatus 10 in the normal mode has the same volume level as that of the audio signal input thereto. Said output audio signal is represented by the following equation:

$$Y = L \ (0 \leq L \leq 100\%)$$

When the viewer selects the attenuation mode of the apparatus 10 through the infrared remote control device 50 or the functional key on the television itself, the MCU 1010 controls the switch 1024 to switch the circuit 102 to the attenuation mode. In such case, the audio signal transmitted by the tuner of the television is input to the adjustor 1022. The audio processor 104 obtains a volume level of the audio signal input to the adjustor 1022. Audio signals whose volume levels are lower than or equal to a threshold value Ld are defined as belonging to a low section of input volume, whereas audio signals whose volume levels are higher than Ld are defined as belonging to a high section of input volume. The volume level of Y corresponding to Ld is defined as Yd, and the volume level Yd is equal to Ld. When an audio signal input to the adjustor 1022 has a volume level in the low section, the adjustor 1022 outputs the volume level to the audio processor 104. The audio processor 104 then returns a same volume level back to the adjustor 1022. When an audio signal input to the adjustor 1022 has a volume level Lk that is in the high section, the adjustor 1022 outputs the volume level Lk to the audio processor 104. The audio processor 104 then returns a volume level Yk back to the adjustor 1022. The volume level Yk is higher than Yd and lower than Lk, and is lower than or equal to Ym. Ym is a predefined maximum volume level of the audio signal which can be output by the adjustor 1022. Thus, the solid line in FIG. 2 describes a relationship between input volume level and output volume level of the audio signal traveling through the apparatus 10 in the attenuation mode. The audio signal may correspond to a television program, an advertisement or an unexpected noise such as interference. Said audio signal is represented by the following equation:

$$Y = \begin{cases} L & (0 \leq L \leq L_d) \\ Y_k & (L_d < L \leq 100\%, L_d < Y_k < L, Y_k \leq Y_m) \end{cases}$$

The adjustor 1022 then outputs to the switch 1024 an audio signal according to the volume level returned by the audio processor 104. When the audio signal input to the adjustor 1022 has a volume level in the high section, the audio signal output by the adjustor 1022 is an attenuated audio signal. By way of the switch 1024 and the audio processor 104, the attenuated audio signal is amplified by the amplifier 40, and then broadcast by a speaker of the television. Consequently, audio signals having volume levels in the high section and being broadcast by the speaker of the television are attenuated audio signals. In this way, the viewer avoids being bothered by loud advertisements or unexpected noises.

In the present exemplary embodiment, the above-mentioned parameters Ld and Ym are predefined by a television manufacturer. In an alternative exemplary embodiment, Ld and Ym are defined by the viewer according to his/her particular requirements. When the apparatus 10 is in the attenuation mode, the viewer can simultaneously adjust sound volume via the infrared remote control device 50 or a functional key on the television itself according to his/her particular requirements. In order to realize the above-described function of adjusting sound volume, the MCU 1010 controls the degree to which the amplifier 40 amplifies the audio signal. The apparatus 10 of the present invention is also applicable to other audio systems besides televisions, such as radios, CD disc players and personal stereos.

Figure 3:
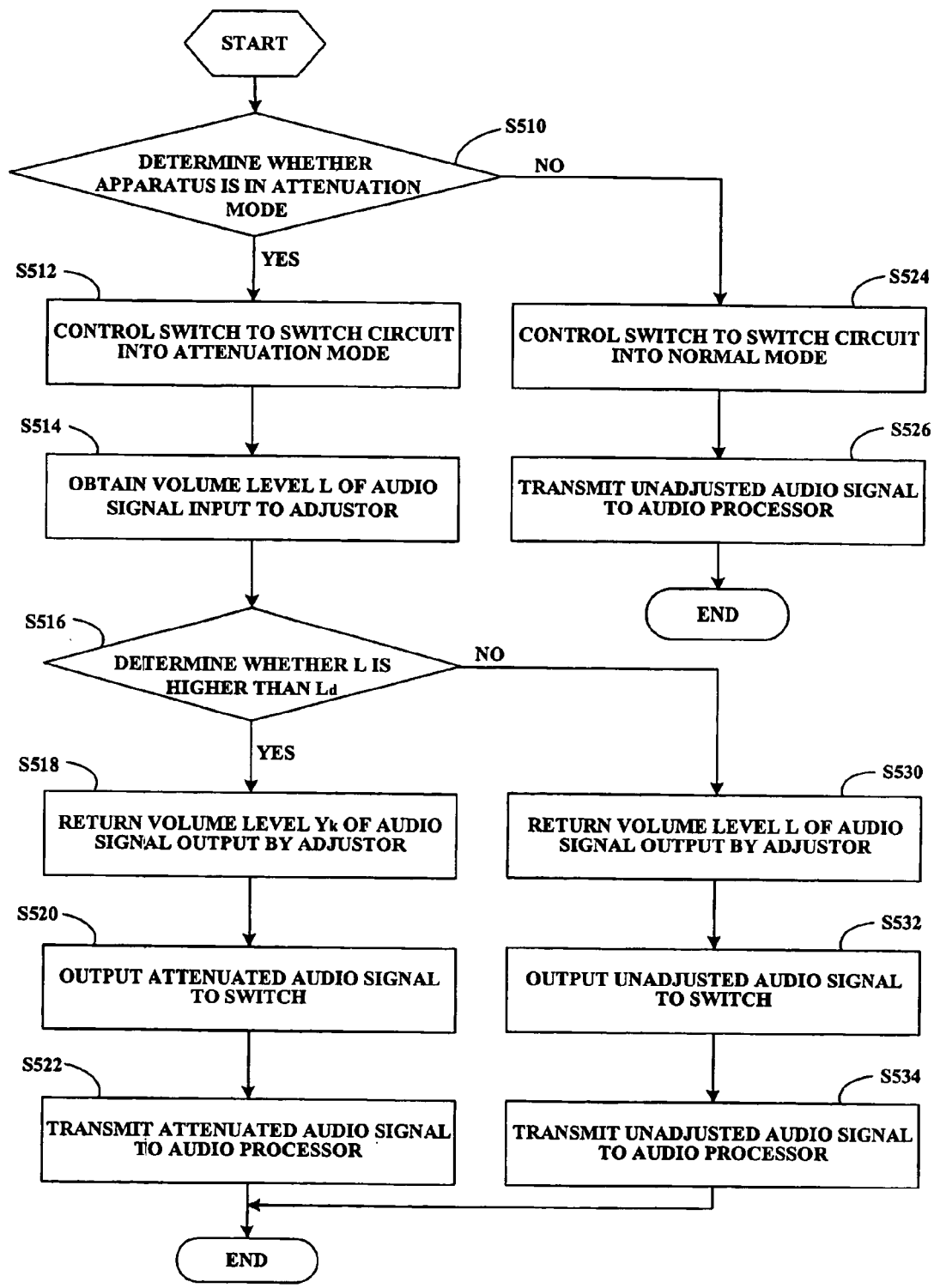
FIG. 3 is a flow chart of an exemplary method for adjusting sound volume according to the present invention.

FIG. 3 is a flow chart of the exemplary method for adjusting sound volume according to the present invention. A viewer selects an operating mode of the apparatus 10 via the infrared remote control device 50 or a functional key on the television itself. At step S510, the MCU 1010 determines whether the apparatus 10 is in the attenuation mode. If so, the procedure goes to step S512 described below. Otherwise, the procedure goes to step S524. At step S524, the MCU 1010 controls the switch 1024 to switch the circuit 102 into the normal mode. Then at step S526, the switch 1024 transmits an unadjusted audio signal to the audio processor 104, whereupon the procedure is ended. At step S512, the MCU 1010 controls the switch 1024 to switch the circuit 102 to the attenuation mode. Then at step S514, the audio processor 104 obtains a volume level L of the audio signal input to the adjustor 1022.

Then at step S516, the audio processor 104 determines whether L is higher than Ld. Ld is a threshold value predefined by a television manufacturer. If L is not higher than Ld, the procedure goes to step S530 described below. If L is higher than Ld, the procedure goes to step S518. At step S518, the audio processor 104 returns a volume level Yk back to the adjustor 1022. The volume level Yk is higher than Ld and lower than L, and is lower than or equal to Ym. Ym is the predefined maximum volume level of the audio signal which can be output by the adjustor 1022. Then at step S520, the adjustor 1022 outputs to the switch 1024 an attenuated audio signal according to the volume level Yk. Then at step S522, the switch 1024 transmits the attenuated audio signal to the audio processor 104, whereupon the procedure is ended. At step S530, the audio processor 104 returns the same volume level L back to the adjustor 1022. Then at step S532, the adjustor 1022 outputs to the switch 1024 an unadjusted audio signal according to the volume level L. Then at step S534, the switch 1024 transmits the unadjusted audio signal to the audio processor 104, whereupon the procedure is ended.

The above-mentioned procedure is repeated continually from the time the viewer turns on the television until the time the viewer turns off the television.

While a preferred embodiment and preferred method of the present invention have been described above, it should be understood that they have been presented by way of example only and not by way of limitation. Thus the breadth and scope of the present invention should not be limited by the above-described exemplary embodiment and method, but should be defined only in accordance with the following claims and their equivalents.

What is claimed is:

1. An apparatus for adjusting sound volume for an audio system, the apparatus comprising:
   a controller connected to an amplifier of the audio system for controlling the amplification of the amplifier, the controller comprising:
   a Microprogrammed Control Unit (MCU);
   an audio processor;
   a circuit for adjusting sound volume, the circuit comprising:
      an adjustor connected to the audio processor for outputting of audio signals under the control of the audio processor; and
      a switch coupled to the audio processor, the adjustor connecting to the switch, the MCU controlling the switch to switch to a selected operating mode of the circuit; and
   a communication port, the controller controlling the amplification of the amplifier through the communication port;
   wherein the audio signals are transmitted to the audio processor via the switch.

2. The apparatus as claimed in claim 1, wherein the controller further comprises a random-access memory (RAM) communicating with the MCU, and a nonvolatile memory communicating with the MCU.

3. The apparatus as claimed in claim 2, wherein the nonvolatile memory is a Read-Only Memory (ROM), an Erasable and Programmable Read-only Memory (EPROM), an Electrically Erasable Programmable Read-only Memory (EEPROM), or a flash memory.

4. The apparatus as claimed in claim 1, wherein the apparatus has a normal mode and an attenuation mode.

5. The apparatus as claimed in claim 4, wherein the circuit has a normal mode and an attenuation mode.

6. The apparatus as claimed in claim 5, wherein when the apparatus is in the normal mode, the MCU controls the switch to switch the circuit to the normal mode.

7. The apparatus as claimed in claim 6, wherein audio signals are input to the switch, and then transmitted to the audio processor.

8. The apparatus as claimed in claim 7, wherein an output audio signal of the apparatus is the same as a corresponding input audio signal thereof.

9. The apparatus as claimed in claim 5, wherein when the apparatus is in the attenuation mode, the MCU controls the switch to switch the circuit to the attenuation mode.

10. The apparatus as claimed in claim 9, wherein audio signals are input to the adjustor, and are subsequently transmitted to the audio processor via the switch.

11. The apparatus as claimed in claim 10, wherein the audio processor controls the adjustor to output attenuated or unadjusted audio signals to the switch.

12. The apparatus as claimed in claim 11, wherein the output attenuated or unadjusted audio signals are related to input audio signals based on the following equation:

$$Y = \begin{cases} L & (0 \leq L \leq L_d) \\ Y_k & (L_d < L \leq 100\%, L_d < Y_k < L, Y_k \leq Y_m) \end{cases}$$

wherein L represents a volume level of an input audio signal, Ld represents a threshold volume level of input audio signals, Y represents a volume level of the output attenuated or unadjusted audio signal, Yk represents a volume level of the output attenuated audio signal, and Ym is a maximum possible volume level of output attenuated audio signals.

13. The apparatus as claimed in claim 12, wherein Ld and Ym are predefined by a manufacturer of the apparatus.

14. The apparatus as claimed in claim 12, wherein Ld and Ym are predefined by a user according to his/her requirements.

* * * * *

UNITED STATES PATENT AND TRADEMARK OFFICE
CERTIFICATE OF CORRECTION

PATENT NO.      : 7,599,504 B2                                           Page 1 of 1
APPLICATION NO. : 10/955285
DATED           : October 6, 2009
INVENTOR(S)     : Kuan-Hong Hsieh It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1406 days.

Signed and Sealed this

Twenty-eighth Day of September, 2010

David J. Kappos
*Director of the United States Patent and Trademark Office*